(12) United States Patent
Saxelby, Jr. et al.

(10) Patent No.: US 6,549,409 B1
(45) Date of Patent: Apr. 15, 2003

(54) POWER CONVERTER ASSEMBLY

(75) Inventors: John R. Saxelby, Jr., Maynard, MA (US); Michael D. Evans, Lexington, MA (US); Patrizio Vinciarelli, Boston, MA (US)

(73) Assignee: VLT Corporation, San Antonio, TX (US)

( * ) Notice: Subject to any disclaimer, the term of this patent is extended or adjusted under 35 U.S.C. 154(b) by 64 days.

(21) Appl. No.: 09/643,159

(22) Filed: Aug. 21, 2000

(51) Int. Cl.[7] .................................................. H05K 7/20
(52) U.S. Cl. ...................... 361/704; 361/707; 361/713; 361/719; 174/52.2; 165/80.3; 165/185
(58) Field of Search .................................. 361/704, 707, 361/715, 717–721, 723, 761; 174/52.2, 52.4, 52.3; 257/687, 706, 707, 787, 796; 165/80.2, 185

(56) References Cited

U.S. PATENT DOCUMENTS

| | | | |
|---|---|---|---|
| 3,737,729 A | 6/1973 | Carney | |
| 4,394,530 A | 7/1983 | Kaufman | |
| 4,691,265 A | 9/1987 | Calver et al. | |
| 4,724,514 A | 2/1988 | Kaufman | |
| 4,879,630 A | 11/1989 | Boucard et al. | |
| 4,899,257 A | 2/1990 | Yamamoto | |
| 5,075,821 A | * 12/1991 | McDonnal | 361/721 |
| 5,111,362 A | 5/1992 | Flamm et al. | |
| 5,258,888 A | 11/1993 | Korinsky | |
| 5,365,403 A | 11/1994 | Vinciarelli et al. | |
| 5,375,040 A | * 12/1994 | Cooper et al. | 361/730 |
| 5,742,478 A | * 4/1998 | Wu | 361/704 |
| 5,778,526 A | 7/1998 | Vinciarelli et al. | |
| 5,808,358 A | 9/1998 | Vinciarelli et al. | |
| 5,906,310 A | 5/1999 | Vinciarelli et al. | |
| 5,926,373 A | * 7/1999 | Stevens | 361/704 |
| 5,973,923 A | * 10/1999 | Jitaru | 361/704 |
| 6,147,869 A | * 11/2000 | Furnival | 361/719 |
| 6,297,549 B1 | * 10/2001 | Hiyoshi | 257/703 |

FOREIGN PATENT DOCUMENTS

| | | |
|---|---|---|
| DE | 9100467 | 5/1992 |
| DE | 9217155.9 | 2/1993 |
| JP | 4-287396 | 10/1992 |
| WO | WO 94/03038 | 2/1994 |

* cited by examiner

*Primary Examiner*—Boris Chervinsky
(74) *Attorney, Agent, or Firm*—Fish & Richardson P.C.

(57) ABSTRACT

A power converter assembly includes a heat sinking plate, a circuit board structure having a side that faces and is spaced by a gap from a surface of the heat sinking plate that is nearer to said side, a relatively thin, high heat density, dissipative semiconductor component mounted on said side, an encapsulating material filling the gap, and relatively taller, lower heat density, components mounted on the other side of the circuit board, the gap being characterized by an average thermal-resistance of less than 1° C.–in$^2$/Watt.

46 Claims, 11 Drawing Sheets

POWER CONVERTER ASSEMBLY

BACKGROUND

This invention relates to a power converter assembly.

A typical DC-to-DC power converter assembly, for example, includes power-dissipating semiconductor components, such as transistors, SCRs, and rectifiers, magnetic energy storage elements, such as transformers and output filter inductors that have magnetic cores surrounded by one or more windings and electric energy storage elements, such as input and output filter capacitors.

A DC-DC power converter is often packaged in a rectangular "brick" format, as shown in FIG. 1. Heat dissipated by components within the converter 100 is withdrawn through a metal surface 102, referred to as a baseplate. Electrical connections to the converter are made through pins 104.

In one known kind of power converter assembly, as shown in FIG. 2, the baseplate 103 includes a metal plate 102 bonded to an insulating layer 106. Components on the top surface 108 of the insulating layer 106, such as transformer 110 and resistor 112, are interconnected by conductive traces 113 on surface 108. Power dissipating components (e.g., a power semiconductor 114) are mounted directly on the top surface of the insulating medium so that dissipated heat is removed through the baseplate. A printed circuit board assembly 116, which also has conductive traces 117 that interconnect control electronics and other components (e.g., an integrated circuit 118), is mounted above the baseplate 103 on standoffs 119. Electrical connections between the printed circuit board assembly 116 and components and traces on the top surface of the baseplate 103 are made through pins 120 and component leads (e.g., a lead 122 of power semiconductor 114). (As used herein the terms "component" and "circuit element" refer to electronic or energy storage components (e.g., semiconductors, resistors, capacitors and magnetic devices) and excludes interconnection devices (e.g, termination pins, connectors) and packaging and assembly elements (e.g., standoffs, cases).)

Another known kind of power converter assembly, shown in FIG. 3A, also has a baseplate assembly 124 and a printed circuit board assembly 126. Power dissipating devices 128 are mounted on the baseplate assembly. The printed circuit board assembly includes components, such as a transformer 130 and an output inductor 132, mounted on a printed circuit board 127. A non-conductive case 129 attaches to the baseplate 124, enclosing the printed circuit board assembly 126. The power converter assembly 100 is filled with an encapsulating material (not shown).

As shown in FIG. 3B, and described in U.S. Pat. No. 5,722,508, "Packaging Electrical Circuits" (assigned to the same assignee as this application and incorporated by reference), the baseplate assembly 124 may include a metal heat-spreading plate 142 separated from the metal plate 102 by an insulating sheet 144. Power dissipating components 128 include a semiconductor die 134 mounted on and connected to conductive pads 136 on the surface of an insulating substrate 138. The substrate 138 is connected to the heat spreading plate 142 by solder 140. Conductive traces 146 on the printed circuit board 127 connect to conductive pads 136 on the power-dissipating device 128 through solder 148.

In a third known kind of power converter assembly, shown in FIGS. 4A and 4B, a printed circuit board assembly 150 includes components 160a, 160b mounted on both sides of a printed circuit board 152. A "printed circuit transformer" on the circuit board assembly includes a magnetic core 154, which passes through holes 156a, 156b in the printed circuit board. Windings (not shown), formed by conductive etches on the surfaces of one or more layers of the printed circuit board, surround the holes 156a, 156b and the core. The distances by which the core 154 extends above and below the printed circuit board 152 are approximately equal. Power dissipating semiconductors 158, and other components of various heights 160b, are mounted on the side of the printed circuit board which faces an inside surface 162 of a metal case 164. An encapsulant 166 fills the space between the printed circuit board assembly 150 and the metal case. Heat from the power dissipating components 158 passes through the encapsulant 166 and into the metal case 164.

SUMMARY

In general, in one aspect the invention features a power converter assembly comprising a heat sinking plate, a circuit board structure having a side that faces and is spaced by a gap from a surface of the heat sinking plate that is nearer to said side, a dissipative semiconductor component mounted on said side, and an encapsulating material filling the gap, the gap being characterized by an average thermal-resistance of less than $3°$ C.$-$in$^2$/Watt.

Implementations of the invention may include one or more of the following features. The heat sinking plate may be planar. The circuit board structure may include a planar circuit board that holds power conversion elements of a power converter circuit. The power conversion elements may include a transformer having cores and in which no portion of any of the cores lies in the gap. The power conversion elements include the semiconductor component. The semiconductor component may include a MOSFET or a diode. The average thermal resistance may be less than $2°$ C.$-$in$^2$/Watt. The average thermal resistance may be less than $1°$ C.$-$in$^2$/Watt.

In general, in another aspect of the invention, components on the circuit board structure together comprise a power conversion circuit that is capable of accepting power from a source and delivering power to a load, the components including a semiconductor component mounted on the side of the circuit board that faces the surface of the heat sinking plate. The circuit board divides the total volume occupied by the assembly into a gap volume between the circuit board and the plate, and a remaining volume, the gap volume being no more than 25% of the total volume.

Implementations of the invention may include one or more of the following features. The power conversion elements may include a transformer having cores and in which no portion of any of the cores lies in the gap. The gap volume may be no more than 15% of the total volume, preferably no more than 10% of the total volume.

In general, in another aspect of the invention, the gap has a gap volume that is enclosed by (a) the surface of the heat sinking plate, (b) the side of the circuit board that faces the surface of the heat sinking plate, and (c) a perimeter surface that connects the perimeters of (a) and (b) and which extends perpendicular to, and upward from, the surface of said heat sinking plate. The upper volume is enclosed by (a) the surface of the heat sinking plate, (b) an imaginary plane that is parallel to and spaced above the side of the circuit board which does not face the surface of the heat sinking plate, the plane being tangent to the top of a component without intersecting any other component, and (c) the perimeter surface. The gap volume is no more than 25% of the upper volume.

In general, in another aspect of the invention, no part of the permeable core of a magnetic power conversion component faces the side of the circuit board that faces the surface of the heat sinking plate.

Among the advantages of the invention are that internal temperature rises of components within a power converter may be kept small while the circuit board and baseplate of a power converter can be fabricated less expensively, more easily, and with higher yield than when heat-dissipating devices are mounted directly on the baseplate before the baseplate is attached to the circuit board assembly. A larger number of small power dissipating semiconductor devices can be used because the assembly technique is relatively forgiving and yield losses are still within acceptable levels. This permits placing the switching devices in locations on the board that are closer to the portions of the circuit to which they connect while spreading out the heat to enable the encapsulant to transfer it to the baseplate with a low temperature rise.

Other advantages and features will become apparent from the following description and from the claims.

DETAILED DESCRIPTION

Figure 1:
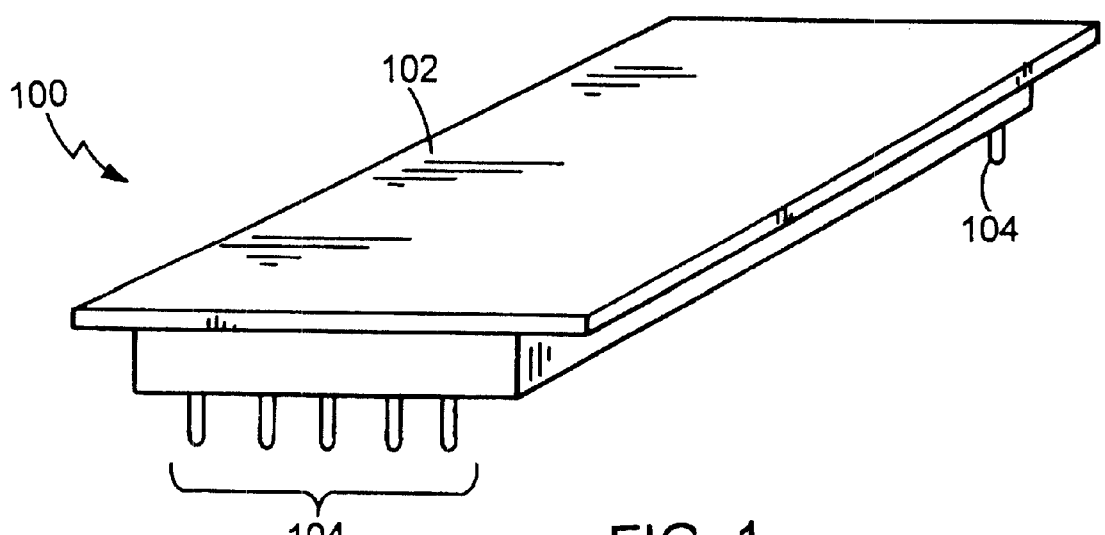
FIG. 1 shows a perspective view of a power converter assembly.
Figure 2:
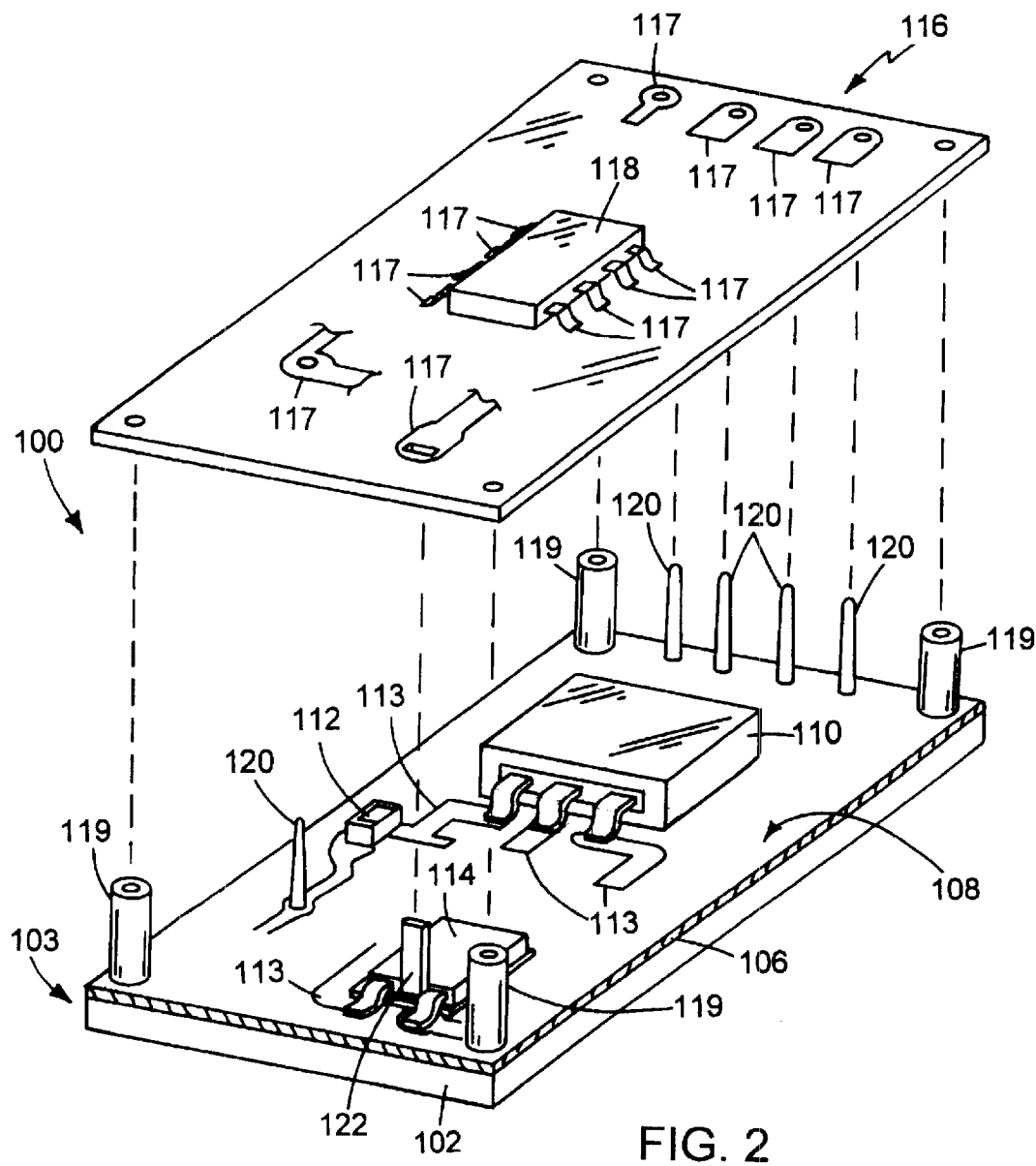
FIG. 2 shows an exploded perspective view of a power converter assembly.
Figure 3A:
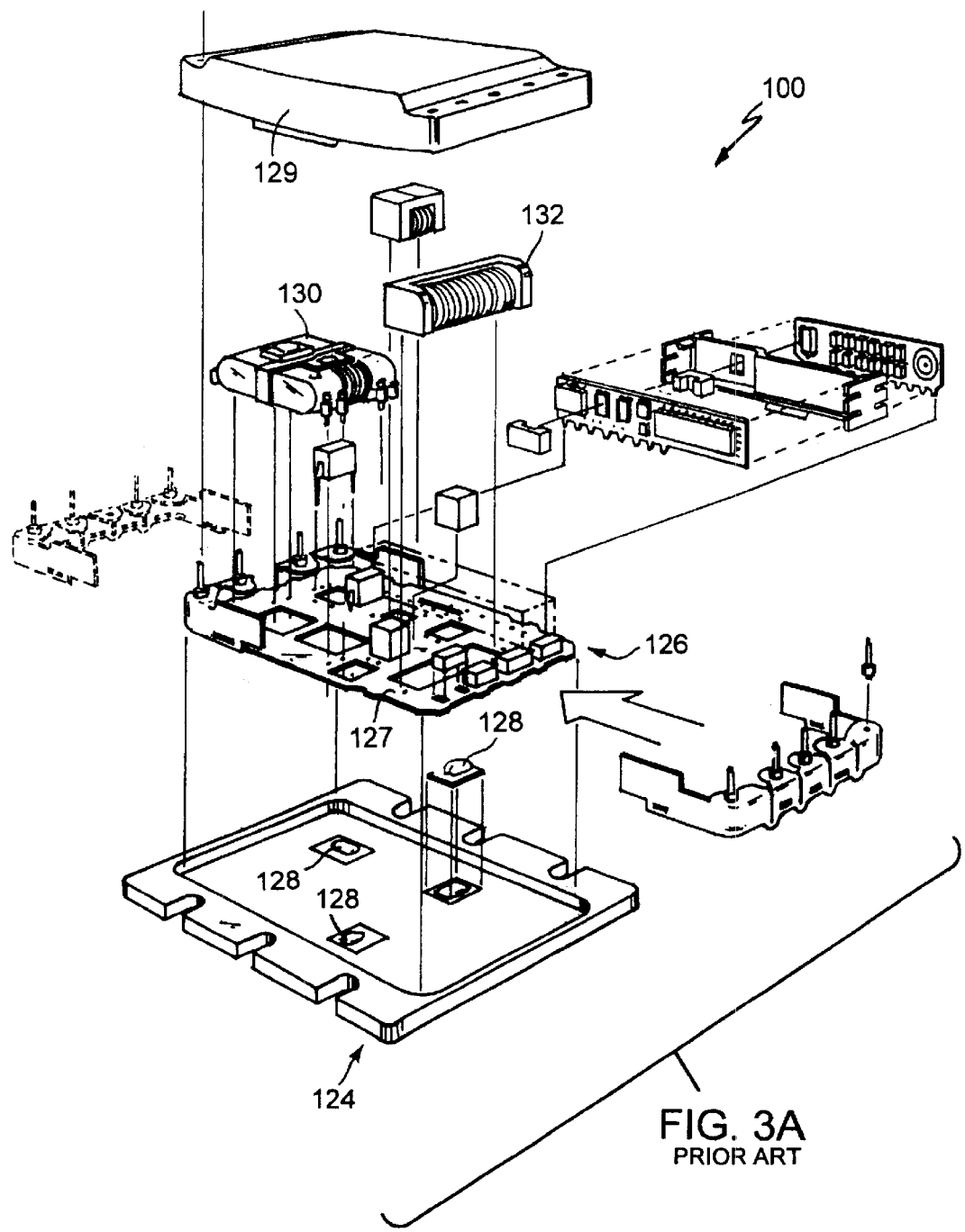
FIG. 3A shows an exploded perspective view of another power converter assembly.
Figure 3B:
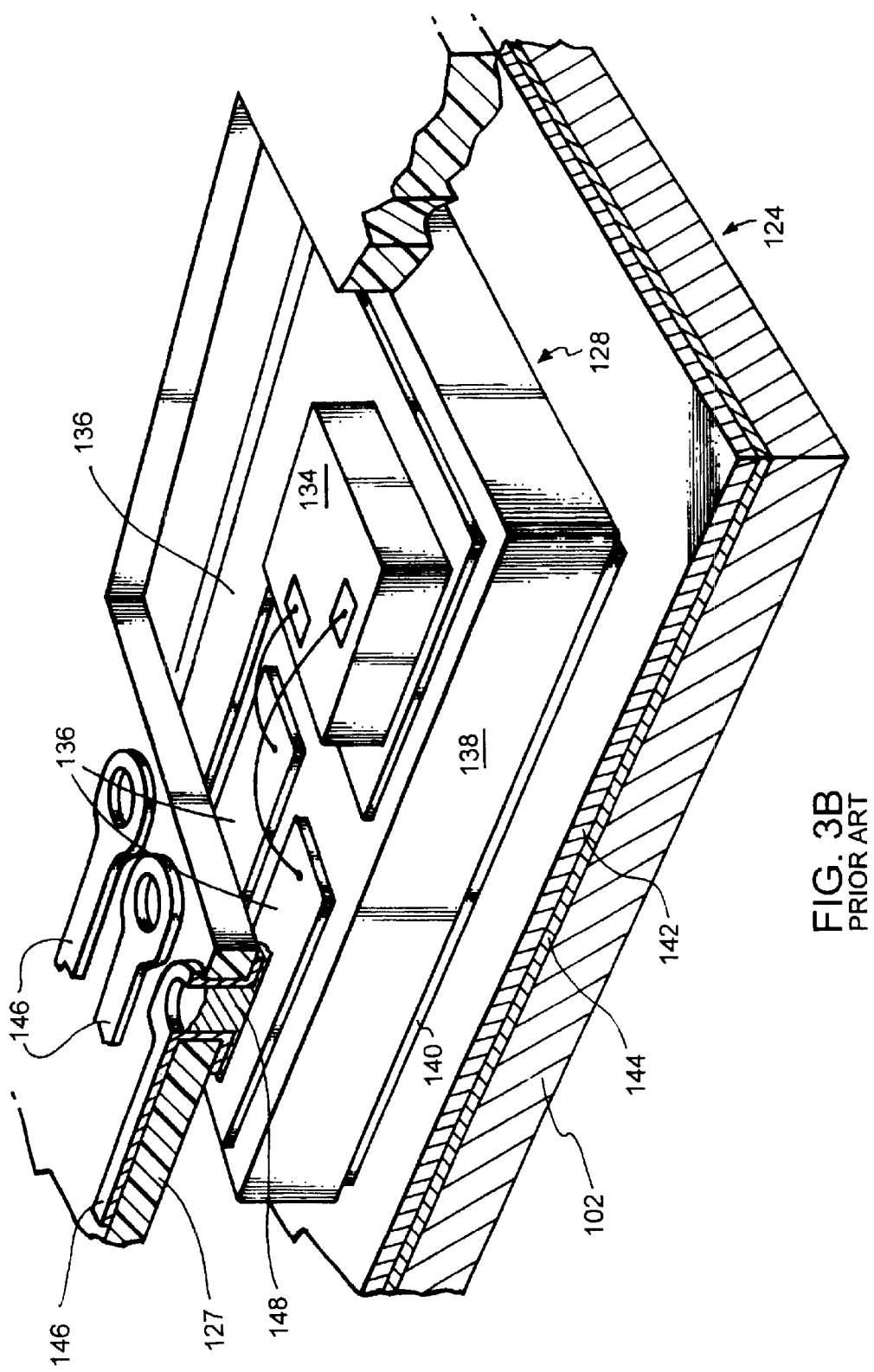
FIG. 3B shows details of the power converter assembly of FIG. 3A.
Figure 4A:
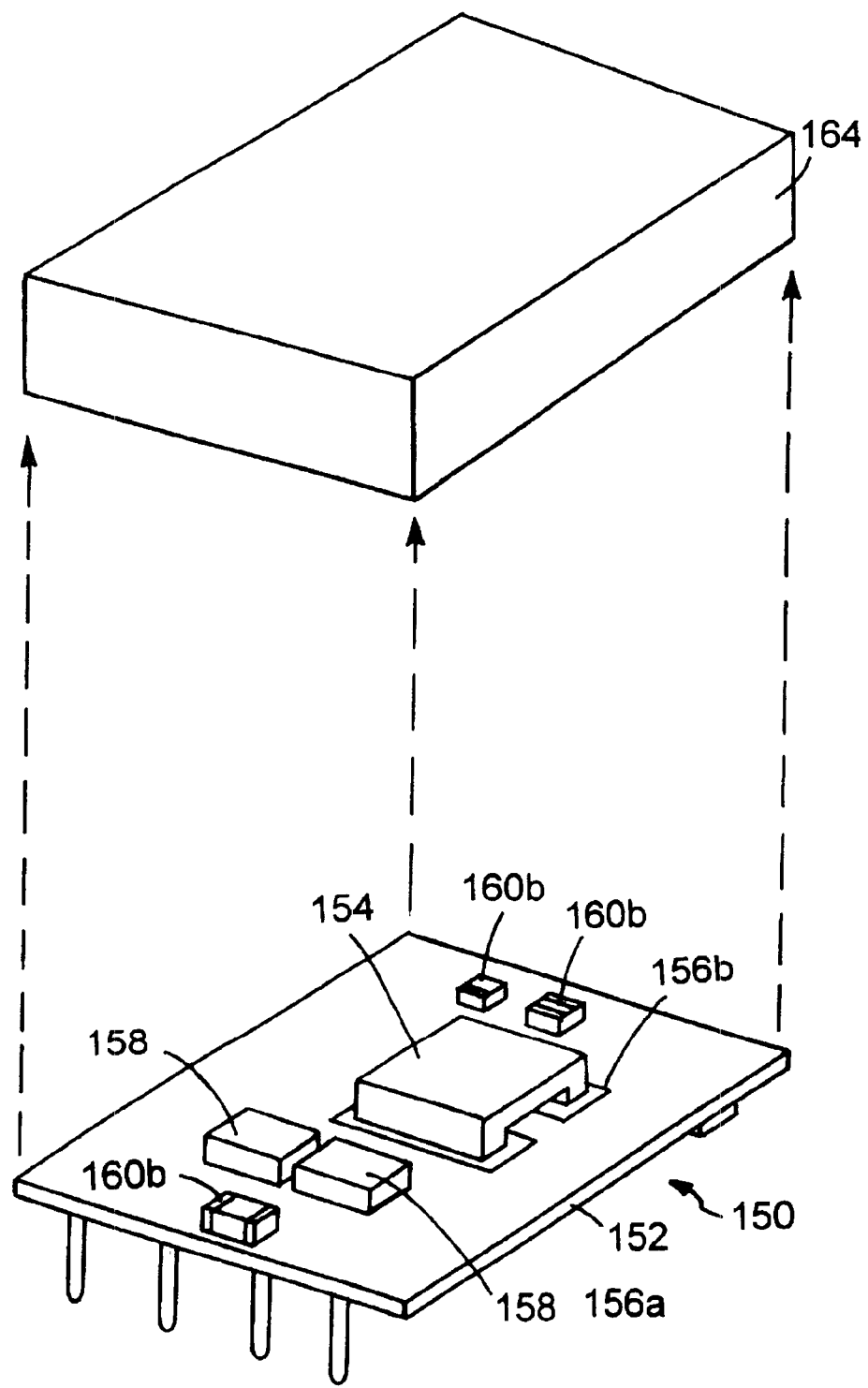
FIG. 4A shows an exploded perspective view of another power converter assembly.
Figure 4B:
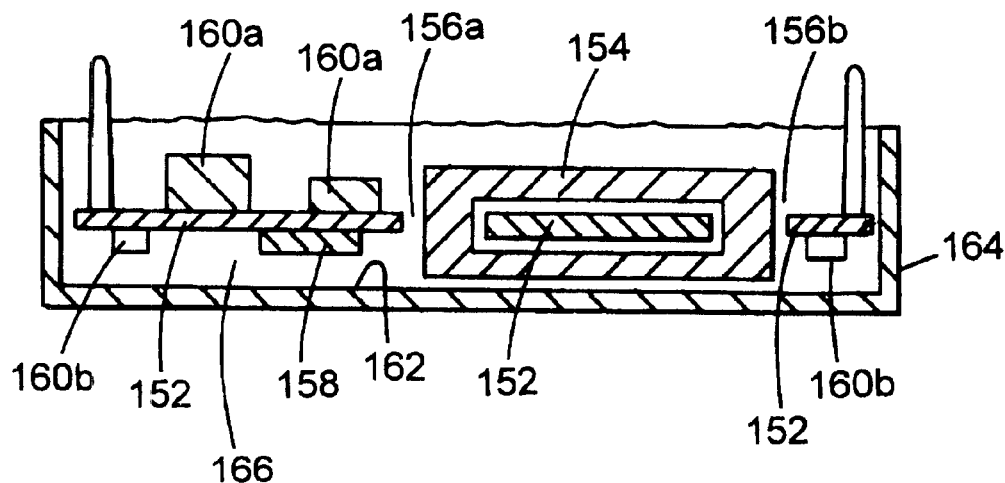
FIG. 4B shows a sectioned view of the power converter assembly of FIG. 4A.
Figure 5:
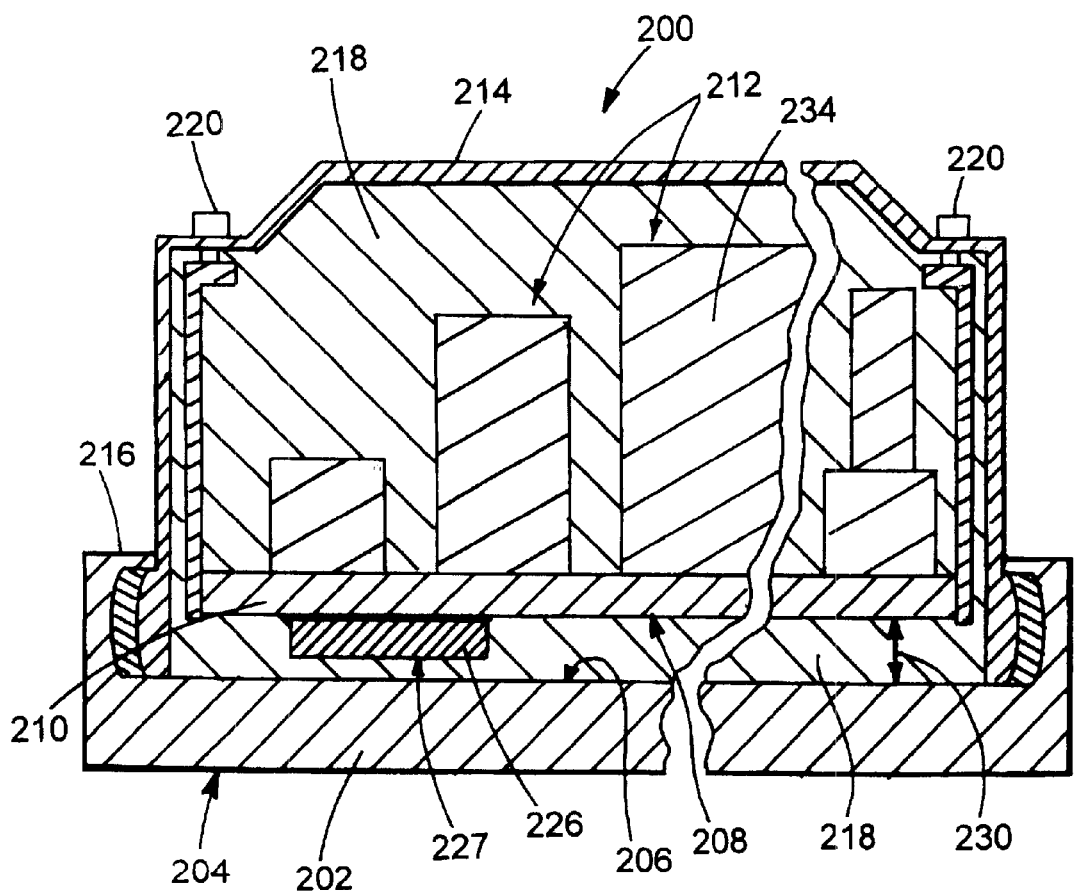
FIG. 5 is a sectional side view, broken away, of a power converter assembly.

As shown in FIG. 5, a power converter assembly 200 has a metal, heat-dissipating planar baseplate 202 with an exposed lower surface 204. An internal surface 206 of the baseplate faces a bottom side 208 of a printed circuit board assembly 210. Components 212, 226 of a power converter circuit are mounted on both sides of the circuit board. A lid 214 mates with a lip 216 around the perimeter of the converter assembly and an encapsulant 218 fills the remaining space within the package. Electrical terminals 220 enable connections to be made from the outside world to the converter circuit. Additional information about packaging techniques that can be used to join the lid to the base, fill the inner space with encapsulant, connect the circuit board to the electrical terminals, and form the heat sink are set forth in U.S. Pat. No. 5,365,403 and 5,720,324, incorporated by reference.

In the example shown in FIG. 5, the only components that are mounted on the bottom side of the circuit board are semiconductor power dissipating components 226 (only one is shown, but there could be two or more), e.g., MOSFET switches or rectifying diodes, that dissipate heat. The components 226 can be contained in chip-scale semiconductor packaging so that their total thickness T is, e.g., 0.060 inches or less. An adaptation of the MLP package (a semiconductor package approximately 0.2" wide×0.2" long×0.035" thick, having terminations which are exposed on, and essentially coplanar with, one of its surfaces; available from Carsem Inc., Ipoh, West Malaysia) can be made for power semiconductors in a nominal thickness of 0.035 inch. Even thinner packaging can be achieved, e.g., a bare power semiconductor chip can be terminated with conductive "bumps" and mounted via the bumps to pads on the board. Thinner chip packaging more fully exploits the benefits of the invention because it results in smaller gaps between the back of the board and the baseplate and lower thermal resistance.

Each of the components 226 is connected by leads to conductive traces (not shown) on the bottom side of the circuit board. A small clearance (e.g., of thickness 0.015 inches or less) is provided between the outer surface 227 of components 226 and the internal face 206 of the baseplate to permit easy assembly without damage to the components. Because the components are relatively thin, the gap 230 between the bottom of the circuit board and the upper surface of the baseplate can be relatively small. The gap should be made as small as possible while satisfying requirements for electrical insulation and void-free encapsulation.

The upper side of the circuit board holds the rest of the components 212 that, together with the circuit board, and the components 226 make up a complete power converter circuit that can accept power from an external source, convert it, and deliver it to an external load. The components 212 include energy storing components such as a transformer 234 that includes a core (not shown). In some embodiments, no portion of any of the cores associated with any of the energy storing components on the upper side of the circuit board project into the space on the underside of the circuit board.

Heat is dissipated by certain components on each side of the board. For example, components 226 (which may, for example, be a MOSFET switching transistor) and transformer 234 may dissipate comparable amounts of heat. However, in a typical power converter, semiconductor devices, such as individual power MOSFETs, will occupy a much smaller volume than a transformer. Thus, the relative heat dissipation density (i.e., the heat dissipated by the component divided by the volume occupied by the component) of the MOSFET will be much higher than that of the transformer and the task of removing heat from the MOSFET will be more challenging. Said another way, the relative surface areas of the two parts makes it more difficult to limit the temperature rise of the MOSFET than it is for the transformer.

The invention exploits differences in heat densities by placing relatively thin high heat density dissipators, such as power semiconductor components, on the side of the board 208 which faces the inner surface 206 of the baseplate, and in close proximity to it, thereby providing tight thermal coupling between these components and the baseplate. Other, relatively taller lower heat density components, such as energy storing components and other components, are located on the upper side of the board and their heat is dissipated by passing through the circuit board (or through openings in the board), through the epoxy encapsulant, and into the baseplate.

Figure 7:
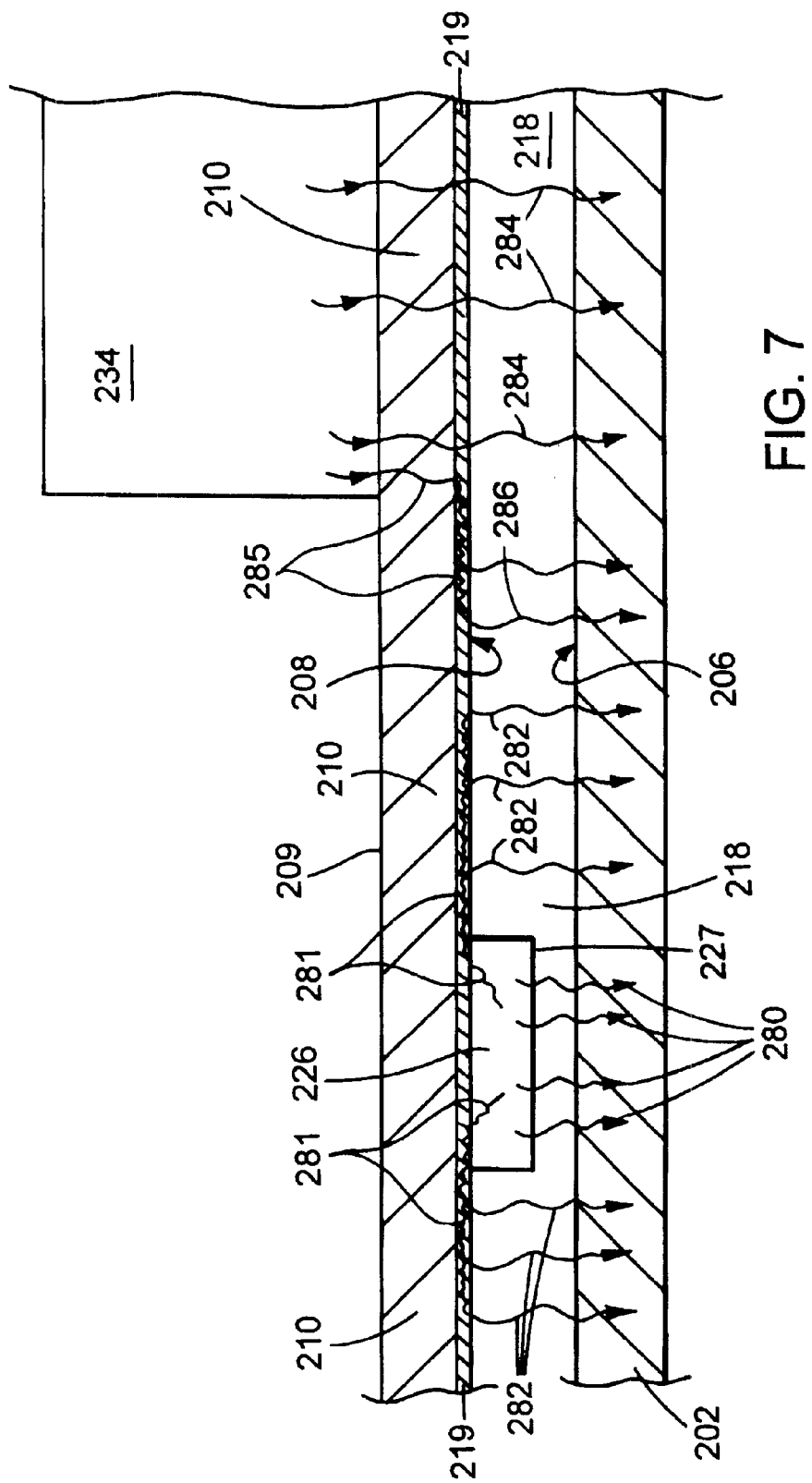
FIG. 7 shows the flow of dissipated heat in a power converter according to the invention.

As known in the prior art, temperature rise in components can be minimized by using conductive features on the back of a printed circuit board to spread dissipated heat over a large area. As illustrated by arrows 280 in FIG. 7, some of the heat dissipated by a high density dissipative component 226 will flow from the surface 227 of the component, through the encapsulant 218 and into the baseplate 202. However, heat will also pass from the component 226 into thermally conductive etch 219, as illustrated by arrows 218, and be conducted by the etch over a relatively large area. As illustrated by arrows 282, this heat will flow from the etch 219, through the encapsulant 218 and into the baseplate 202. The larger area results in an overall reduction in thermal resistance between the component 226 and the baseplate 210. Use of thermally conductive etch 219 as a heat spreader is an important factor in reducing temperature rise.

As also shown by arrows 284, some of the heat from lower density components (e.g., transformer 234) on top of the printed circuit board 210 passes directly through the board, thorough the encapsulant 218 and into the baseplate 202. As illustrated by arrows 285 and 286, heat is also spread by the etch 219, as described above, resulting in lower temperature rise in the component 234. Use of conductive etch on the top of the printed circuit board (not shown), or on inner layers of multilayer boards (not shown), will provide further improvement in heat spreading and a further reduction in the temperature rise of components on top of the board.

Temperature rise will decrease as the thickness and area of coverage of the etch 219 are increased.

Figure 8:
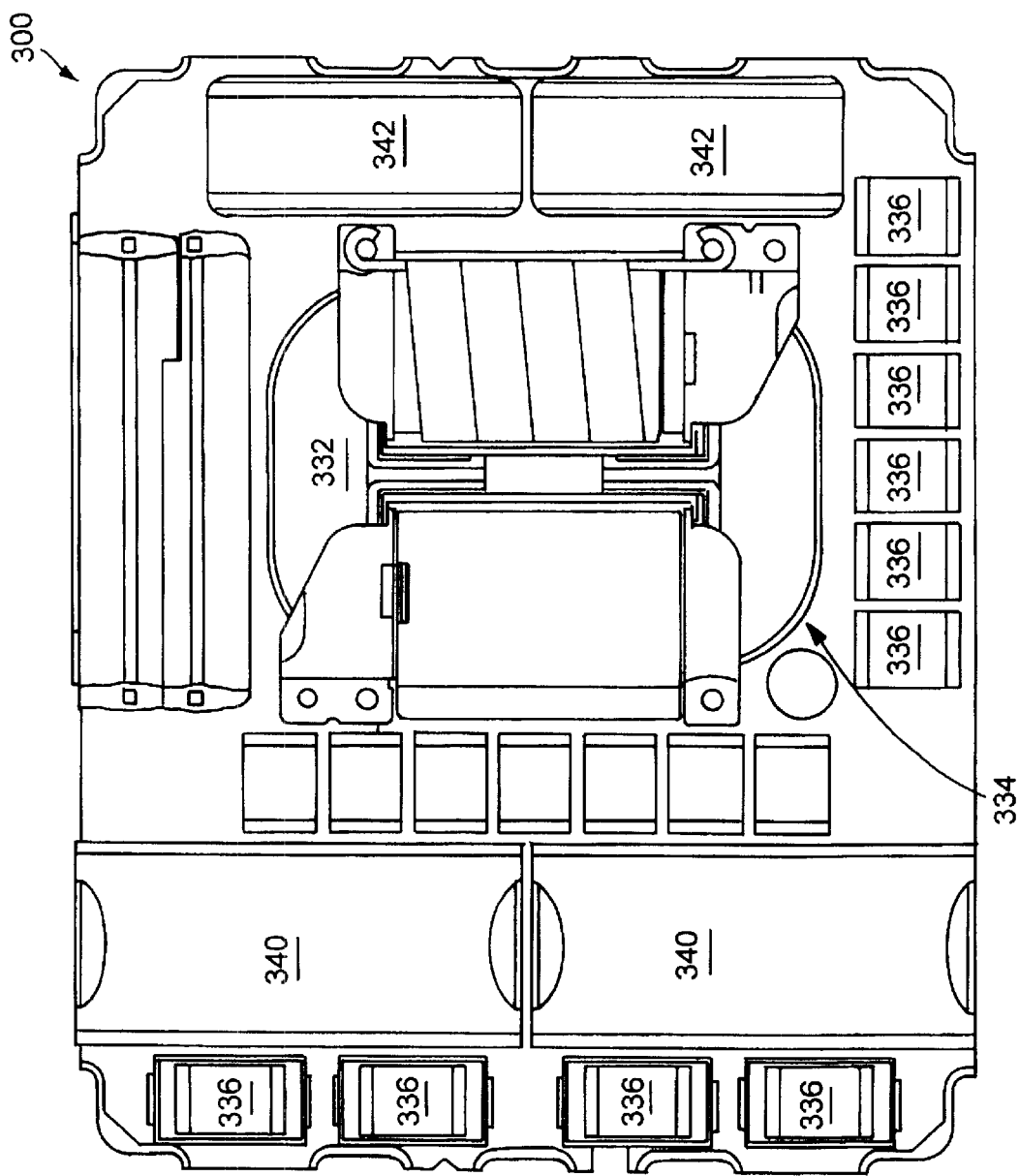
FIGS. 8 and 9 show top and bottom views, respectively, of a printed circuit board assembly 300 for a transformer isolated single-ended power converter.
Figure 9:
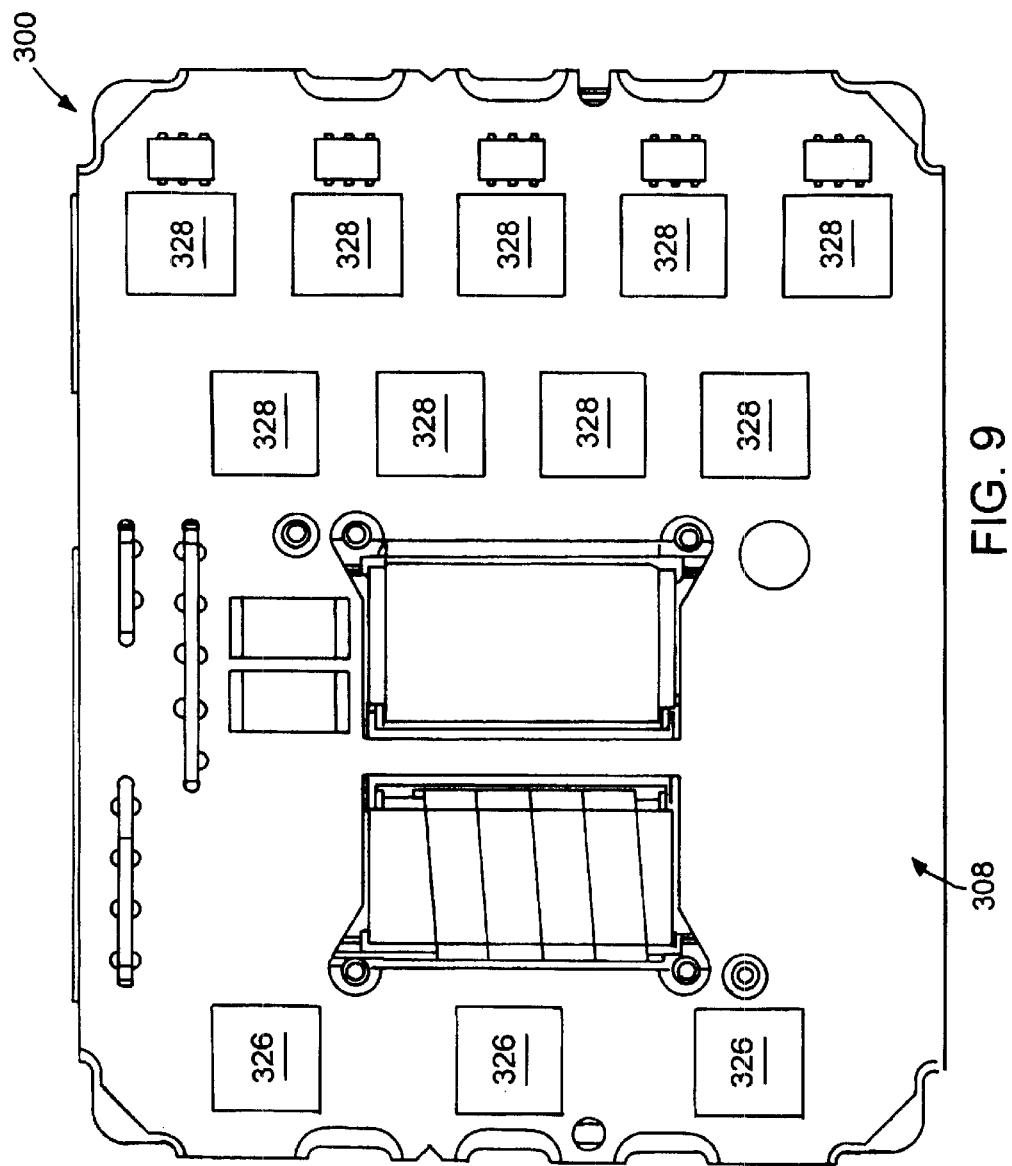

FIGS. 8 and 9 show top and bottom views, respectively, of a printed circuit board assembly 300 for a transformer isolated single-ended power converter. The converter, when complete, has overall dimensions of 2.2 inches long, 1.6 inches wide and 0.5 inches high (the height includes the thickness of the baseplate, which is not shown) and delivers 300 Watts. The bottom view of FIG. 9 shows the surface of the printed circuit board assembly, which contains power dissipating semiconductors. A total of 12 power-dissipating semiconductors are used, comprising three MOSFETS 326 and nine Schottky rectifier diodes 328. Total dissipation in the semiconductor devices is approximately 25 to 30 Watts. An additional approximately 10 Watts is dissipated in other components (e.g., in FIG. 8, transformer 334 including core 332, capacitors 336, inductors 340, 342). The gap between the bottom surface of the printed circuit board (FIG. 9) and the inner face of the baseplate (not shown) is nominally 0.050 inch. All power dissipating semiconductors 326, 328 are in MLP packages having a nominal thickness of 0.035 inch. More than 60% of the back surface 308 of the printed circuit board 308 is covered with 3 ounce copper etch for spreading heat.

For the power converter described above, the encapsulant must have a relatively low thermal resistance through the gap. Good materials for this purpose include X-32-2020, made by Shin Etsu Silicones of America. Inc., which has a bulk thermal conductivity of 1.9 W/m-° K and a viscosity of 100,000 centipoise and Dow-Corning 1-4173 which has a bulk thermal conductivity of 1.9 W/mK and a viscosity of 58,000 centipoise. It is possible to successfully fill the small gap between the circuit board and the baseplate with 100,000 centipoise material using the spin-filling technique described in U.S. Pat. No. 5,720,324. Use of this encapsulant in the converter of FIGS. 8 and 9 results in a thermal resistance between the bottom surface of the board (FIG. 9) and the inner surface of the baseplate of approximately 0.3° C./Watt (or an average thermal-resistance-per-unit-area of approximately 1° C.–in$^2$/Watt) and an average temperature rise of 10° C. with a total dissipation of 35 Watts.

Other encapsulants could be used if they have a bulk thermal conductivity greater than 1.9 W/m-° K, preferably in the range of 2.5 to 4.0 W/m-° K. Choice of encapsulant is a tradeoff between thermal performance, viscosity (which affects the formation of undesirable voids during filling) and cost. At the time of filing of this application the most preferable bulk thermal conductivity is 2.5 W/m-° K. In combination with a gap of 0.050", a bulk thermal conductivity of 2.5 W/m-° K leads to a thermal-resistance-per-unit-area of less than 1° C.–in$^2$/Watt.

By using very thin switching components on the bottom of the board and by spin filling a high thermal conductivity encapsulant into the gap, it is possible to achieve a combination of desirable results. The height and overall volume of the gap can be kept small. Heat can be dissipated with a low temperature rise. Assembly of the package can be made simpler, resulting in improved yields relative to assembly schemes in which semiconductor devices are mounted on the baseplate before assembly.

Figure 6:
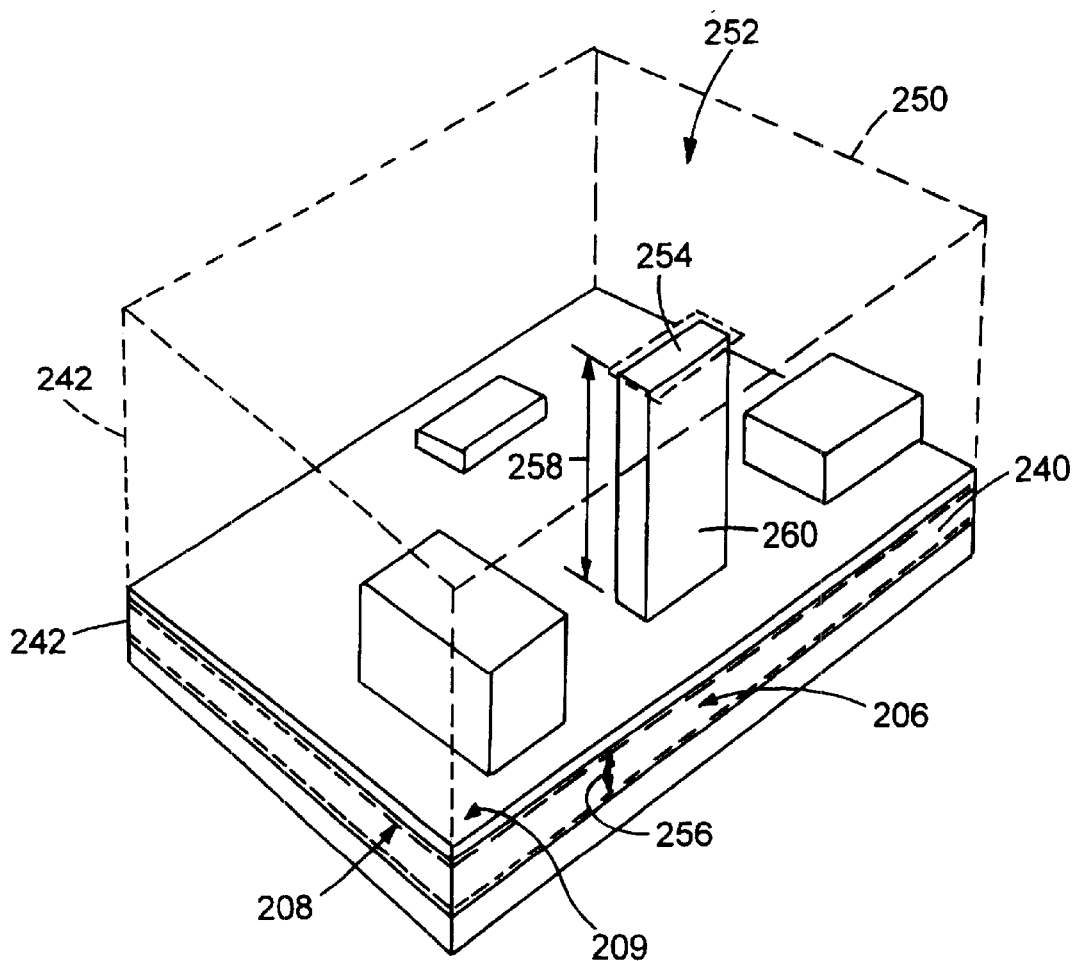
FIG. 6 is a perspective view of a power converter assembly illustrating certain volume relationships.

At least some of these advantages are achieved as a result of the relationships among certain volumes and heights as shown in FIG. 6. A gap volume 240 can be defined as the volume enclosed by the upper surface 206 of the baseplate, the bottom side 208 of the printed circuit board and a vertical perimeter surface 242 that contains the perimeter of the baseplate. Similarly, a component volume 250 can be defined as the volume enclosed by the upper surface of the circuit board 209, the perimeter surface 242 and a plane 252 that is parallel to the baseplate and touches the uppermost point 254 on any of the components 212. The total volume of the assembly can then be construed as essentially the gap volume plus the component volume (the volume occupied by the printed circuit board being ignored). The ratio of the gap volume to the total volume is less than 25%, preferably less than 15%, most preferably less than 10%. The ratio of the gap height 256 to the height 258 of tallest component 260 is less than 25%, preferably less than 15%, most preferably less than 10%. Other examples are also within the scope of the following claims. For example, the invention can be applied to packaged electronic assemblies other than power supplies. For example, an electronic module may comprise a high heat density heat-generating component, such as a microprocessor, and one or more lower heat density components, e.g., a packaged DC-DC converter, filter capacitors. In such a device the microprocessor is located on the side of a printed circuit board which faces, and is in close proximity to, a metal baseplate, the gap being filled with a thermally conductive encapsulant. The lower heat density components are located on the other side of the board. In some embodiments, the baseplate may not be flat but may have geometric features such as steps or grooves. Thus, thermal conductivities defined herein are average values over relevant areas of the baseplate. The printed circuit board may be any suitable substrate, e.g., fiberglass composite, ceramic, paper composite.

What is claimed is:
1. A power converter assembly comprising
   a heat sinking plate,
   a circuit board structure comprising a circuit board having a first side and a second side, wherein the first side faces and is spaced by a gap from a surface of the heat sinking plate that is nearer to said first side,
   a dissipative semiconductor component mounted on said first side, and
   an encapsulating material filling the gap,
   the gap being characterized by an average thermal-resistance of less than 3° C.–in2/Watt.

2. The power converter assembly of claim 1 in which the heat sinking plate is planar.

3. The power converter assembly of claim 1 in which the circuit board is planar and holds power conversion elements of a power converter circuit.

4. The power converter assembly of claim 3 in which the power conversion elements include a transformer having a core and in which no portion of the core lies in the gap.

5. The power converter assembly of claim 3 in which the power conversion elements include the semiconductor component.

6. The power converter assembly of claims 1 or 5 in which the semiconductor component comprises a MOSFET.

7. The power converter assembly of claims 1 or 5 in which the semiconductor component comprises a diode.

8. The power converter assembly of claim 1 in which the average thermal resistance is less than 2° C.-in$^2$/Watt.

9. The power converter assembly of claim 1 in which the average thermal resistance is less than 1° C.-in$^2$/Watt.

10. A power converter assembly comprising
    a heat sinking plate,
    a circuit board structure comprising
        a circuit board having a first side and a second side, wherein the first side faces and is spaced by a gap from a surface of the heat sinking plate that is nearer to said first side, and
        components on the circuit board comprising a semiconductor component mounted on the first side of the circuit board,
    a power conversion circuit comprising the components and being capable of accepting power from a source and delivering power to a load,
    the circuit board dividing the total volume occupied by the assembly into a gap volume between the circuit board and the plate, and a remaining volume, the gap volume being no more than 25% of the total volume.

11. The power converter assembly of claim 10 in which the heat sinking plate is planar.

12. The power converter assembly of claim 11 in which the components include a transformer having a core and in which no portion of the core lies in the gap.

13. The power converter assembly of claims 10 or 12 in which the semiconductor component comprises a MOSFET.

14. The power converter assembly of claims 10 or 12 the semiconductor component comprises a diode.

15. The power converter assembly of claim 10 in which the gap volume is no more than 15% of the total volume.

16. The power converter assembly of claim 10 in which the gap volume is no more than 10% of the total volume.

17. A power converter assembly comprising
    a heat sinking plate,
    a circuit board structure comprising
        a circuit board having a first side and a second side, wherein the first side faces and is spaced by a gap from a surface of the heat sinking plate that is nearer to said first side, and
        components on the circuit board comprising a heat dissipating semiconductor component mounted on the first side of the circuit board, and
    a power conversion circuit comprising the components and being capable of accepting power from a source and delivering power to a load,
    the gap having a gap volume that is enclosed by (a) the surface of the heat sinking plate, (b) the first side of the circuit board, and (c) a perimeter surface that connects (a) and (b) along a perimeter of the overlap of (a) and (b) and which extends perpendicular to, and upward from, the surface of said heat sinking plate,
    an upper volume that is enclosed by (a) the surface of the heat sinking plate, (b) an imaginary plane that is parallel to and spaced above the second side of the circuit board, the plane being tangent to the top of a component without intersecting any other component, and (c) the perimeter surface,
    the gap volume being no more than 25% of the upper volume.

18. The power converter assembly of claim 17 in which the heat sinking plate is planar.

19. The power converter assembly of claim 17 in which the components include a transformer having a core and in which no portion of the core lies in the gap.

20. The power converter assembly of claims 17 or 19 in which the semiconductor component comprises a MOSFET.

21. The power converter assembly of claims 17 or 19 which the semiconductor component comprises a diode.

22. The power converter assembly of claim 17 in which the gap volume is no more than 15% of the upper volume.

23. The power converter assembly of claim 17 in which the gap volume is no more than 10% of the upper volume.

24. A power converter assembly comprising
    a heat sinking plate,
    a circuit board structure comprising
        a circuit board having a first side and a second side, wherein the first side faces and is spaced by a gap from a surface of the heat sinking plate that is nearer to said first side, and
        components on the circuit board comprising a heat dissipating semiconductor component mounted on the first side of the circuit board, and
    a power conversion circuit comprising the components and being capable of accepting power from a source and delivering power to a load,
    such that, for any imaginary volume consisting of:
        a partial gap volume that is enclosed by (a) a portion of the surface of the heat sinking plate within an area of overlap between the circuit board and the baseplate, (b) the first side of the circuit board, and (c) a partial periphery surface which extends upward from the periphery of the portion of the surface of the heat sinking plate and which is perpendicular to the surface of the heat sinking plate, and
        a partial upper volume that is enclosed by (a) the portion of the surface of the heat sinking plate, (b) an imaginary plane that is parallel to and spaced above the second side of the circuit board, the plane being tangent to the top of a component without intersecting any other component, and (c) the partial periphery surface,
    the partial gap volume being no more than 25% of the partial upper volume.

25. The power converter assembly of claim 24 in which the heat sinking plate is planar.

26. The power converter assembly of claim 24 in which the components include a transformer having a core and in which no portion of the core lies in the gap.

27. The power converter assembly of claims 24 or 26 in which the semiconductor component comprises a MOSFET.

28. The power converter assembly of claims 24 or 26 in which the semiconductor component comprises a diode.

29. The power converter assembly of claim 24 in which the gap volume is no more than 15% of the upper volume.

30. The power converter assembly of claim 24 in which the gap volume is no more than 10% of the upper volume.

31. A power converter assembly comprising
   a heat sinking plate,
   a circuit board structure comprising
      a circuit board having a first side and a second side wherein the first side faces and is spaced by a gap from a surface of the heat sinking plate that is nearer to said first side, and
      components on the circuit board comprising a heat dissipating semiconductor component mounted on the first side of the circuit board and a magnetic power conversion component having a permeable core, and in which no part of the permeable core faces the first side of the circuit board, and
   a power conversion circuit comprising the components that is capable of accepting power from a source and delivering power to a load.

32. The power converter assembly of claim 31 in which the heat sinking plate is planar.

33. The power converter assembly of claims 31 or 32 in which the semiconductor component comprises a MOSFET.

34. The power converter assembly of claims 31 or 32 in which the semiconductor component comprises a diode.

35. The power converter assembly of claim 31 in which the gap comprises gap volume which is no more than 25% of an upper volume.

36. The power converter assembly of claim 31 in which the gap comprises a gap volume which is no more than 15% of an upper volume.

37. The power converter assembly of claim 31 in which the gap comprises a gap volume which is no more than 10% of an upper volume.

38. A power converter assembly comprising
   a heat sinking plate,
   a circuit board structure comprising a circuit board having a first side that faces and is spaced by a gap from a surface of the heat sinking plate that is nearer to said side, and a second side,
   a power conversion circuit comprising components on the first and second sides of said circuit board including a heat dissipating power conversion circuit element on the first side, and being capable of accepting power from a source and delivering power to a load,
   the circuit board dividing the total height occupied by the assembly into a gap height and a remaining height,
   the gap height being the average distance, over the area of the circuit board, between the surface of the heat sinking plate and the first side of the circuit board,
   the remaining height being the distance between the second side of the circuit board and an imaginary plane that is parallel to and spaced above the second side, the plane being tangent to the top of a component without intersecting any other component,
   the gap height being no more than 25% of the total height.

39. The power converter of claim 38 in which the gap height is no more than 15% of the total height.

40. The power converter of claim 38 in which the gap height is no more than 10% of the total height.

41. A power converter assembly comprising
   a heat sinking plate having a surface,
   a circuit board structure comprising a circuit board having a first side and a second side, wherein the first side faces and is spaced by a gap from a surface of the heat sinking plate that is nearer to said first side, and
   a power conversion circuit comprising components on the first and second sides of said circuit board including a heat dissipating power conversion circuit element on the first side, and being capable of accepting power from a source and delivering power to a load,
   the gap having a gap height between the surface of the heat sinking plate and the first side of the circuit board,
   a total height being defined as the distance between the surface of the heat sinking plate and an imaginary surface that is parallel to the surface of the heat sinking plate and touches a point on any of the components that is farthest away from the surface of the heat sinking plate,
   the gap height being no more than 25% of the total height.

42. The power converter of claim 38 in which the gap height is no more than 15% of the total height.

43. The power converter of claim 38 in which the gap height is no more than 10% of the total height.

44. An electronic circuit assembly comprising
   electronic components including (a) relatively higher heat-density heat-generating components having relatively lower heights, and comprising (b) relatively lower heat-density heat-generating components having relatively taller heights,
   a metal base plate,
   a circuit board in the vicinity of the metal base plate, the electronic components being mounted on the circuit board, at least some of the higher heat-density lower-height components being mounted on a side of the circuit board that faces the base plate, and the lower heat-density, taller-height components all being mounted on another side of the circuit board facing away from the base plate,
   an encapsulant in a gap between the circuit board and the base plate, the encapsulant effecting an average thermal resistance of less than $3°$ C.$-$in$^2$/Watt across the gap,
   the circuit board dividing the total volume occupied by the assembly into a gap volume between the circuit board and the plate, and a remaining volume, the gap volume being no more than 25% of the total volume.

45. The power converter of claim 44 in which the average thermal resistance is less than $2°$ C.$-$in$^2$/Watt across the gap.

46. The power converter of claim 44 in which the average thermal resistance is less than $1°$ C.$-$in$^2$/Watt across the gap.

* * * * *

UNITED STATES PATENT AND TRADEMARK OFFICE
CERTIFICATE OF CORRECTION

PATENT NO. : 6,549,409 B1
APPLICATION NO. : 09/643159
DATED : April 15, 2003
INVENTOR(S) : John R. Saxelby, Jr., Michael D. Evans and Patrizio Vinciarelli It is certified that error appears in the above-identified patent and that said Letters Patent is hereby corrected as shown below:

In the specification:

Column 2, Line 25, "of less than 3° C.-in$^2$/Watt" should be replaced with --of less than 3° C-in$^2$/Watt--

Column 2, Lines 35-36, "may be less than 2°C.-in$^2$/Watt." should be replaced with --may be less than 2° C-in$^2$/Watt.--

Column 2, Line 37, "than 1° C.-in$^2$/Watt." should be replaced with --than 1° C-in$^2$/Watt.--

Column 5, Lines 64-65, "of approximately 0.3° C./Watt" should be replaced with --of approximately 0.3° C/Watt--

Column 5, Line 66, "approximately 1° C.-in$^2$/Watt)" should be replaced with -- approximately 1° C-in$^2$/Watt)--

Column 5, Line 67, "rise of 10°C. with a" should be replaced with --rise of 10° C with a--

Column 6, Line 10, "area of less than 1° C.-in$^2$/Watt" should be replaced with -- area of less than 1° C-in$^2$/Watt--

In the claims:

Claim 1, Column 6, Line 67, "resistance of less than 3°C.-in2/Watt." should be replaced with -- resistance of less than 3° C-in$^2$/Watt.--

Claim 8, Column 7, Line 17, "is less than 2° C.-in$^2$/Watt." should be replaced with --is less than 2° C-in$^2$/Watt.--

Claim 9, Column 7, Line 19, "is less than 1°C.-in$^2$/Watt." should be replaced with --is less than 1° C-in$^2$/Watt.--

Claim 14, Column 7, Line 44, "The power converter assembly of claims 10 or 12 the" should be replaced with --The power converter assembly of claims 10 or 12 in which the--

Claim 21, Column 8, Lines 18-19, "The power converter assembly of claims 17 or 19 which" should be replaced with --The power converter assembly of claims 17 or 19 in which--

UNITED STATES PATENT AND TRADEMARK OFFICE
CERTIFICATE OF CORRECTION

PATENT NO. : 6,549,409 B1
APPLICATION NO. : 09/643159
DATED : April 15, 2003
INVENTOR(S) : John R. Saxelby, Jr., Michael D. Evans and Patrizio Vinciarelli It is certified that error appears in the above-identified patent and that said Letters Patent is hereby corrected as shown below:

Claim 42, Column 10, Line 25, "The power converter of claim 38 in which" should be replaced with --The power converter of claim 41 in which--

Claim 43, Column 10, Line 27, "The power converter of claim 38 in which" should be replaced with --The power converter of claim 41 in which--

Claim 44, Column 10, Line 47, "resistance of less than 3° C.-in$^2$/Watt" should be replaced with --resistance of less than 3° C-in$^2$/Watt--

Claim 45, Column 10, Line 53, "is less than 2°C.-in$^2$/Watt" should be replaced with --is less than 2° C-in$^2$/Watt--

Claim 46, Column 10, Line 55, "is less than 1° C.-in$^2$/Watt" should be replaced with --is less than 1° C-in$^2$/Watt--

Signed and Sealed this

Twelfth Day of June, 2007

JON W. DUDAS
*Director of the United States Patent and Trademark Office*